(12) United States Patent
Xiao et al.

(10) Patent No.: US 12,456,980 B2
(45) Date of Patent: Oct. 28, 2025

(54) INTERFACE CIRCUIT

(71) Applicant: SG MICRO CORP, Beijing (CN)

(72) Inventors: Fei Xiao, Beijing (CN); Lei Tan, Beijing (CN)

(73) Assignee: SG MICRO CORP, Beijing (CN)

( * ) Notice: Subject to any disclaimer, the term of this patent is extended or adjusted under 35 U.S.C. 154(b) by 266 days.

(21) Appl. No.: 18/260,098

(22) PCT Filed: Oct. 21, 2021

(86) PCT No.: PCT/CN2021/125335
§ 371 (c)(1),
(2) Date: Jun. 30, 2023

(87) PCT Pub. No.: WO2022/142624
PCT Pub. Date: Jul. 7, 2022

(65) Prior Publication Data
US 2024/0056079 A1    Feb. 15, 2024

(30) Foreign Application Priority Data
Dec. 30, 2020  (CN) .......................... 202011605107.0

(51) Int. Cl.
*H03K 19/0185* (2006.01)
*H03K 19/00* (2006.01)
*H03K 19/003* (2006.01)

(52) U.S. Cl.
CPC . *H03K 19/018507* (2013.01); *H03K 19/0027* (2013.01); *H03K 19/00315* (2013.01)

(58) Field of Classification Search
CPC ................... H03K 19/018507; H03K 19/0027
See application file for complete search history.

(56) References Cited

U.S. PATENT DOCUMENTS 6,828,840 B2 * 12/2004 Ohnishi .................. H03K 5/08
327/281
8,242,801 B2 * 8/2012 Greimel-Rechling .......................
H03K 19/1732
326/30
(Continued)

FOREIGN PATENT DOCUMENTS

CN          101924342 A      12/2010
CN          104515946 A       4/2015
(Continued)

OTHER PUBLICATIONS

International Search Report and Written Opinion (including English translations) for International Application No. PCT/CN2021/125335, dated Dec. 23, 2021, 11 pages.

*Primary Examiner* — Menatoallah Youssef
*Assistant Examiner* — Colleen J O Toole
(74) *Attorney, Agent, or Firm* — Westman, Champlin & Koehler, P.A.

(57) ABSTRACT

Disclosed in an interface circuit, in which: a current input circuit receives an input current signal of a signal input terminal, an input voltage detection circuit compares an input voltage signal of the signal input terminal with a reference voltage, and provides a detection signal to the current input circuit according to the comparison result, a phase-inversion output circuit is connected with the current input circuit at the first node, and generates a voltage conversion signal according to a voltage potential of the first node, and a buffer circuit performs signal shaping on the voltage conversion signal to obtain an output signal. The current input circuit pulls up the voltage potential of the first node when the detection signal indicates that the input voltage signal is greater than the reference voltage and the input current signal is greater than a reference current.

6 Claims, 2 Drawing Sheets

(56) References Cited

U.S. PATENT DOCUMENTS

| | | |
|---|---|---|
| 8,432,649 B2 | 4/2013 | Seon |
| 9,188,628 B2 | 11/2015 | Chang et al. |
| 11,041,888 B2 | 6/2021 | Kimura |
| 2010/0296220 A1 | 11/2010 | Seon |
| 2015/0097573 A1 | 4/2015 | Chang et al. |
| 2019/0265280 A1 | 8/2019 | Kimura |

FOREIGN PATENT DOCUMENTS

| | | |
|---|---|---|
| CN | 110196353 A | 9/2019 |
| CN | 112073052 A | 12/2020 |
| CN | 114696816 A | 7/2022 |
| CN | 115833582 A | 3/2023 |
| CN | 115902362 A | 4/2023 |

\* cited by examiner

-Prior Art-

INTERFACE CIRCUIT

CROSS-REFERENCE TO RELATED APPLICATION

The present application is a Section 371 National Stage application of International Application No. PCT/CN2021/125335, filed on Oct. 21, 2021, which published as WO 2022/142624 A1, on Jul. 7, 2022, not in English, and claims priority to a Chinese patent application No. 202011605107.0, entitled "INTERFACE CIRCUIT", filed on Dec. 30, 2020, the contents of which are incorporated herein by reference in their entireties.

FIELD OF THE DISCLOSURE

The present disclosure relates to a technical field of integrated circuits, in particular to an interface circuit.

DESCRIPTION OF THE RELATED ART

Interface circuit is widely used in System on Chip (SoC) and Microcontroller Unit (MCU). It is mainly used for an exchange between a signal inside a chip and a signal outside the chip. The interface circuit is usually used to perform level shifting and driving on data provided inside the chip to generate an external data signal, and/or to perform level shifting on data from outside the chip to obtain a data signal that can be recognized by the chip. At the same time, the interface circuit also provides functions such as enable control, input and output control, pull-up and pull-down control, etc.

FIG. 1 shows a circuit schematic diagram of an interface circuit according to the prior art. As shown in FIG. 1, the interface circuit according to the prior art is implemented, for example, by a Schmitt flip-flop, and the interface circuit 100 includes transistors Mp1 to Mp3, transistors Mn1 to Mn3 and a buffer BUF1. The transistors Mp1, Mp2, Mn2 and Mn1 are sequentially connected in series between a power supply voltage VDD and ground, control terminals of the transistors Mp1, Mp2, Mn2 and Mn1 are connected to each other and are all connected to a signal input terminal to receive an input signal Vin. A control terminal of the transistor Mp3 is connected to a node B between the transistor Mp2 and the transistor Mn2, a first terminal of the transistor Mp3 is connected to an intermediate node between the transistor Mp1 and the transistor Mp2, and a second terminal of the transistor Mp3 is grounded. A control terminal of the transistor Mn3 is connected to the node B between the transistor Mp2 and the transistor Mn2, a first terminal of the transistor Mn3 is connected to the power supply voltage VDD, and a second terminal of the transistor Mn3 is connected to an intermediate node of the transistor Mn1 and the transistor Mn2. An input terminal of the buffer BUF1 is connected to the node B, and an output terminal of the buffer BUF1 is used to provide an output signal Vout.

In the interface circuit as shown in FIG. 1, when the input signal Vin rises from low voltage level (e.g., reference ground) to high voltage level (e.g., power supply voltage VDD), the output signal Vout is flipped to high voltage level (e.g., power supply voltage VDD) when a voltage magnitude of the input signal Vin is greater than a positive reference voltage VIH; when the voltage magnitude of the input signal Vin is lower than a negative reference voltage VIL, the output signal Vout is flipped to low voltage level (e.g., the reference ground) during a process that the input signal Vin drops from high voltage level (e.g., the supply voltage VDD) to low voltage level (e.g., the reference ground).

The interface circuit 100 according to the prior art can only detect the voltage at the signal input terminal and cannot detect current at the signal input terminal. When the signal input terminal is immersed in water gas or other liquid whose dielectric constant is quite different from that of air and printed circuit board (the dielectric constant of air is 1, the dielectric constant of printed circuit board is 4 to 5, and the dielectric constant of pure water is 80), the voltage at the signal input terminal will change. When the voltage at the signal input terminal is greater than the positive reference voltage VIH, the output signal Vout will flip to high voltage level, which may lead to mis-operation in a subsequent circuit.

SUMMARY

In view of this, an objective of embodiments of the present disclosure is to provide an interface circuit, which solves a problem that a circuit may be mistakenly triggered to be turned off/on due to interference from exterior environment, thereby ensuring that a system where the interface circuit is arranged can be normally operated.

According to an embodiment of the present disclosure, an interface circuit is provided, and includes a signal input terminal and a signal output terminal. The interface circuit further includes: a current input circuit, connected with the signal input terminal and used for receiving an input current signal of the signal input terminal; an input voltage detection circuit, connected with the signal input terminal, and used for comparing an input voltage signal of the signal input terminal with a reference voltage to obtain a comparison result, and providing a detection signal to the current input circuit according to the comparison result; a phase-inversion output circuit, connected with the current input circuit at a first node, wherein the phase-inversion output circuit is used for generating a voltage conversion signal according to a voltage potential of the first node; and a buffer circuit, connected with the phase-inversion output circuit and the signal output terminal, used for performing signal shaping on the voltage conversion signal to obtain an output signal and providing the output signal to a signal output terminal. The current input circuit is used for charging the first node to raise the voltage potential of the first node under a condition that the detection signal indicates that the input voltage signal is greater than the reference voltage and the input current signal is greater than a reference current.

Optionally, the current input circuit includes a first current source, a first switch transistor and a second current source, which are sequentially connected in series between a power supply voltage and ground, wherein, an intermediate node between the first current source and the first switch transistor is connected with the signal input terminal, an intermediate node between the second current source and the first switch transistor is connected with the phase-inversion output circuit at the first node, and the first switch transistor is controlled to be on and off by the detection signal.

Optionally, the input voltage detection circuit includes an operational amplifier, an inverting input terminal of the operational amplifier is connected with the signal input terminal to receive the input voltage signal, a non-inverting input terminal of the operational amplifier is used to receive the reference voltage, and an output terminal of the operational amplifier is used to provide the detection signal.

Optionally, the phase-inversion output circuit includes a third current source and a second switch transistor sequentially connected in series between the power supply voltage and the first node. A second node between the third current source and the second switch transistor is used for outputting the voltage conversion signal, and a control terminal of the second switch transistor is used for receiving a bias voltage.

Optionally, the reference current is equal to a difference between an output current of the second current source and an output current of the first current source.

Optional, the first switch transistor is a P-type MOSFET, and the second switch transistor is an N-type MOSFET.

Optionally, the buffer circuit includes two cascaded inverters.

The interface circuit according to embodiments of the present disclosure includes a current input circuit, an input voltage detection circuit, a phase-inversion output circuit and a buffer circuit, wherein the current input circuit is used for receiving an input current signal of the signal input terminal, the input voltage detection circuit is used for comparing an input voltage signal of the signal input terminal with a reference voltage to obtain a comparison result and providing a detection signal to the current input circuit according to the comparison result, the phase-inversion output circuit is connected with the current input circuit at a first node, the phase-inversion output circuit is used for generating a voltage conversion signal according to a voltage potential of the first node, and the buffer circuit is used for performing signal shaping on the voltage conversion signal to obtain an output signal and providing the output signal to a signal output terminal. The current input circuit is used for charging the first node under a condition that the detection signal indicates that the input voltage signal is greater than the reference voltage and the input current signal is greater than a reference current, so as to raise the voltage potential of the first node, so that the output signal of the interface circuit can recover a control signal outside the chip, normally control a post-stage chip, prevent the post-stage chip from being mistakenly triggered off/on, thus ensuring normal operation of a system where a chip with the interface circuit is located.

BRIEF DESCRIPTION OF THE DRAWINGS

The above and other objects, features and advantages of the present invention will become more apparent from the following description of embodiments of the present disclosure with reference to the accompanying drawings.

DETAILED DESCRIPTION OF EMBODIMENTS OF THE DISCLOSURE

Figure 1:
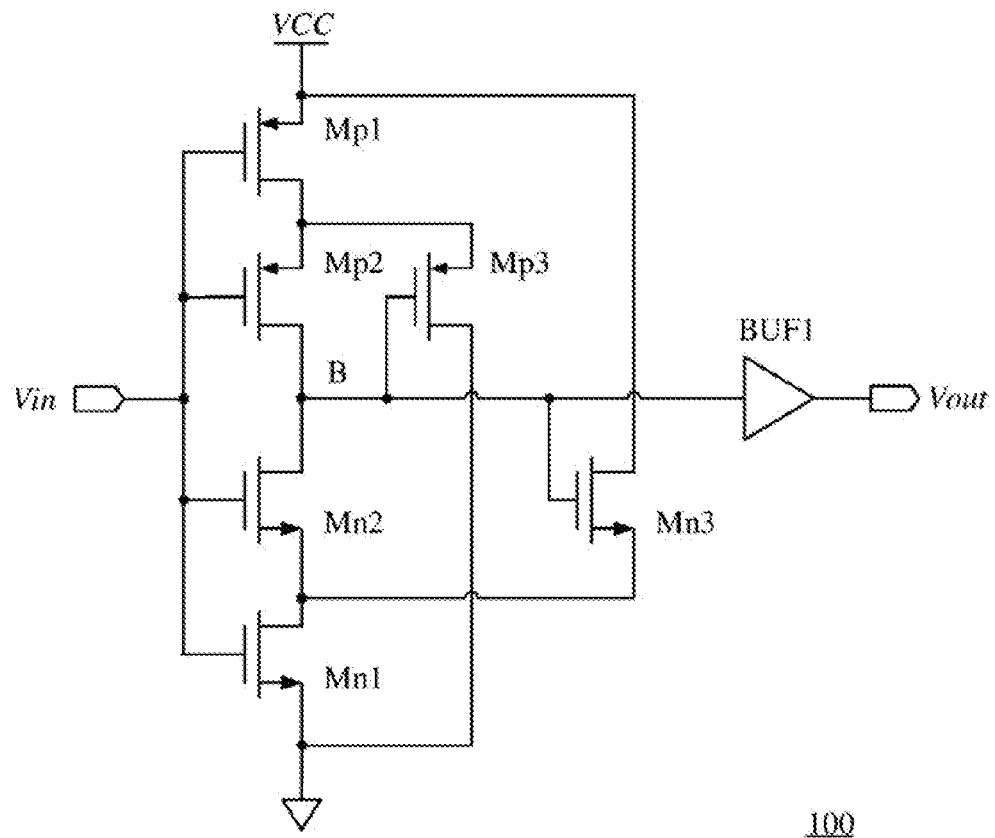
FIG. 1 shows a circuit schematic diagram of an interface circuit according to the prior art.

The present disclosure will be described in more detail below with reference to the accompanying drawings. Throughout the various figures, like elements are denoted by like reference numerals. For the sake of clarity, various parts in the drawings may not be drawn to scale. Additionally, some well-known parts may not be shown in the figures.

Hereinafter, many specific details of the present disclosure, such as structure material, dimension, process, and technique of a component, may be described in order to make the present disclosure better understand. However, as will be understood by those skilled in the art, the present disclosure may be practiced without these specific details.

It should be understood that, in the following descriptions, "circuit" may include one or more of a hardware circuit, a programmable circuit, a state machine circuit and/or an element capable of storing instructions that can be executed by a programmable circuit. When an element or a circuit is "connected" to another element, or an element/circuit is "connected" between two nodes, it may be directly coupled or connected to the other element, or there may be an intermediate element in between, and the connection between the elements may be physical, logical, or a combination thereof. Conversely, when an element is said to be "directly coupled" or "directly connected" to another element, it means that there is no intermediate element between them.

In the present application, a MOSFET includes a first terminal, a second terminal and a control terminal. In a turn-on state of the MOSFET, current flows from the first terminal to the second terminal. The first terminal, the second terminal and the control terminal of the MOSFET of P type are respectively a source, a drain and a gate; and the first terminal, the second terminal and the control terminal of the MOSFET of N type are respectively a drain, a source and a gate.

Figure 2:
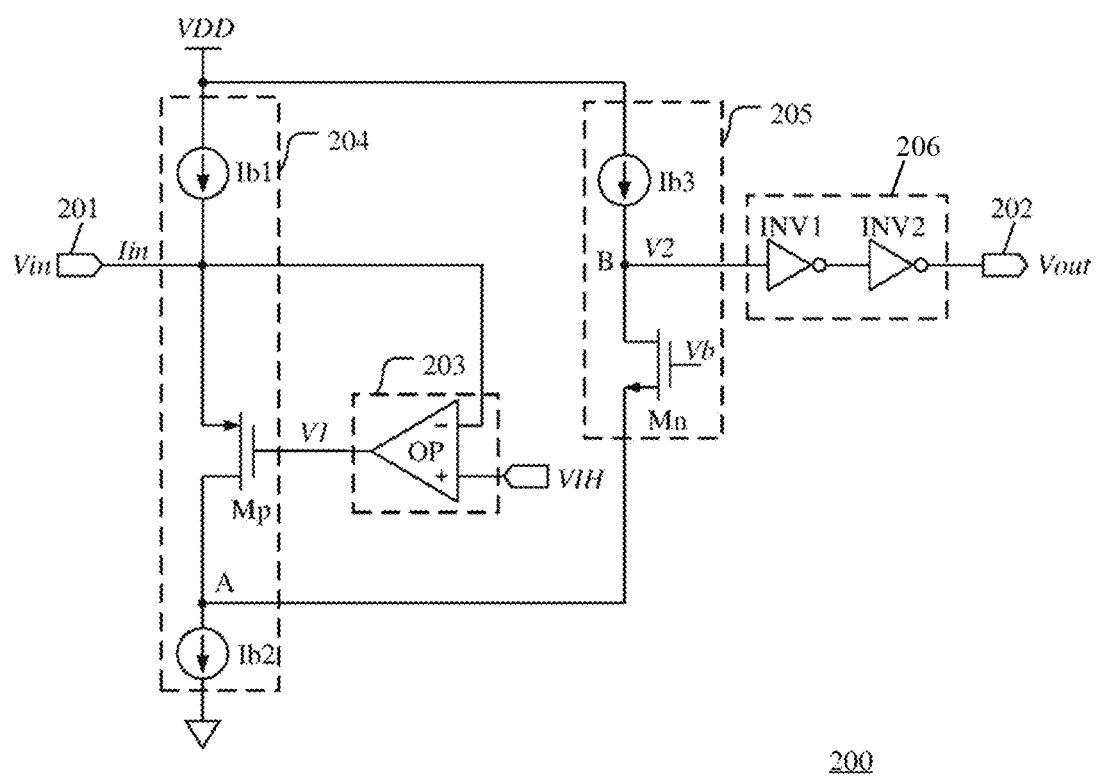
FIG. 2 shows a circuit schematic diagram of an interface circuit according to an embodiment of the present disclosure.

FIG. 2 shows a circuit schematic diagram of an interface circuit according to an embodiment of the present disclosure. As shown in FIG. 2, an interface circuit 200 includes a signal input terminal 201, a signal output terminal 202, an input voltage detection circuit 203, a current input circuit 204, a phase-inversion output circuit 205, and a buffer circuit 206. The signal input terminal 201 is used for receiving an input voltage signal Vin and/or an input current signal Iin, and the signal output terminal 202 is used for providing an output signal Vout.

The input voltage detection circuit 203 is connected to the signal input terminal 201, and is used for comparing the input voltage signal Vin of the signal input terminal 201 with a reference voltage VIH to obtain a comparison result, and providing a detection signal V1 to the current input circuit 204 according to the comparison result. The current input circuit 204 is connected to the signal input terminal 201 and the input voltage detection circuit 203. The current input circuit 204 receives the input current signal Iin of the signal input terminal 201 and compares the input current signal Iin with a reference current. The phase-inversion output circuit 205 is connected to the current input circuit 204 through a node A, and the phase-inversion output circuit 205 is used for generating a voltage conversion signal V2 according to a voltage potential of the node A. The buffer circuit 206 is connected to the phase-inversion output circuit 205 through a node B, and is used for performing signal shaping on the voltage conversion signal V2 to obtain an output signal Vout and supplying the output signal Vout to the signal output terminal 202.

The phase-inversion output circuit 205 is configured to pull the voltage conversion signal V2 low to ground when the voltage potential of the node A is lower than or equal to a preset voltage, and to pull the voltage conversion signal V2 high to the power supply voltage VDD when the voltage potential of the node A is greater than the preset voltage.

Further, the voltage potential of the node A is controlled by the detection signal V1 and the comparison result between the input current signal Iin and the reference current. As an example, in case that the detection signal V1 indicates that the input voltage signal Vin is greater than the reference voltage VIH and the input current signal Iin is greater than the reference current, the current input circuit 204 is used to charge the node A to pull up the voltage potential of the node A and then pull up the voltage conversion signal V2 to the power supply voltage VDD.

In a further embodiment, the input voltage detection circuit 203 includes an operational amplifier OP, an inverting input terminal of which is connected to the signal input terminal 201 to receive the input signal Vin, a non-inverting input terminal of the operational amplifier OP is for receiving the reference voltage VIH, and an output terminal of the operational amplifier OP is for outputting the detection signal V1.

The current input circuit 204 includes a current source Ib1, a switch transistor Mp, and a current source Ib2, which are sequentially connected in series between the power supply voltage VDD and ground. An intermediate node between the current source Ib1 and the switch transistor Mp is connected to the signal input terminal 201, an intermediate node between the current source Ib2 and the switch transistor Mp is connected to the phase-inversion output circuit 205 through the node A, a control terminal of the switch transistor Mp is used for receiving the detection signal V1, and the switch transistor Mp is controlled to be turned on and off by the detection signal V1. The switch transistor Mp is, for example, a P-type MOSFET. When the detection signal V1 is at low voltage level, a current path from the signal input terminal 201 to the node A is turned on by the switch transistor Mp; when the detection signal V1 is at high voltage level, the current path from the signal input terminal 201 to the node A is turned off by the switch transistor Mp.

The phase-inversion output circuit 205 includes a current source Ib3 and a switch transistor Mn sequentially connected in series between the power supply voltage VDD and the node A. The node B between the current source Ib3 and the switch transistor Mn is for outputting the voltage conversion signal V2, and a control terminal of the switch transistor Mn is for receiving a bias voltage Vb. The switch transistor Mn is, for example, an N-type MOSFET. When the voltage potential of the node A is lower than or equal to a voltage difference between the bias voltage Vb and a turn-on threshold voltage of the switch transistor Mn, the switch transistor Mn is turned on to pull down the voltage conversion signal V2 at the node B; when the voltage potential of the node A is greater than or equal to the voltage difference between the bias voltage Vb and the turn-on threshold voltage of the switch transistor Mn, the switch transistor Mn is turned off, and the voltage conversion signal V2 at the node B is pulled up to the power supply voltage VDD by the current source Ib3.

The current sources Ib1 to Ib3 may be provided by a current source bias circuit of the chip, and the buffer circuit 206 may be constituted by two cascaded inverters INV1 and INV2.

When the input voltage signal Vin of the signal input terminal 201 is lower than or equal to the reference voltage VIH, the detection signal V1 output by the operational amplifier OP is at high voltage level, the switch Mp is turned off, and the current path from the signal input terminal 201 to the node A is cut off. At this time, the voltage at the node A is lower than the preset voltage, a voltage difference between the bias voltage Vb and the voltage at the node A is greater than the turn-on threshold voltage of the switch transistor Mn, the switch transistor Mn is turned on, the voltage conversion signal V2 at the node B is pulled down to ground, and the output signal Vout is flipped from high voltage level to low voltage level.

When the input voltage signal Vin of the signal input terminal 201 is higher than the reference voltage signal VIH, the detection signal V1 output by the operational amplifier OP is at low voltage level, the switch transistor Mp is turned on, and the current path from the signal input terminal 201 to the node A is turned on. When the input current signal Iin is lower than or equal to a difference between an output current of the current source Ib2 and an output current of the current source Ib1, the voltage potential at the node A will still be pulled down by the current source Ib2, the switch transistor Mn will be turned on, and the voltage conversion signal V2 at the node B will be pulled down to ground; when the input current signal Iin is higher than the difference between the output current of the current source Ib2 and the output current of the current source Ib1, the input current signal Iin charges the node A, thereby pulling up the voltage potential at the node A. When the voltage potential of the node A is greater than or equal to a preset voltage, a voltage difference between the bias voltage Vb and the voltage potential at the node A is lower than the turn-on threshold voltage of the switch transistor Mn, and the switch transistor Mn is turned off. At this time, the current source Ib3 may apply current to the node B, pulling up the voltage conversion signal V2 at the node B to the power supply voltage VDD, and the output signal is flipped from low voltage level to high voltage level.

In summary, the interface circuit according to embodiments of the present disclosure includes a current input circuit, an input voltage detection circuit, a phase-inversion output circuit and a buffer circuit, wherein the current input circuit is used for receiving an input current signal of the signal input terminal, the input voltage detection circuit is used for comparing an input voltage signal of the signal input terminal with a reference voltage to obtain a comparison result and providing a detection signal to the current input circuit according to the comparison result, the phase-inversion output circuit is connected with the current input circuit through a first node, the phase-inversion output circuit is used for generating a voltage conversion signal according to a voltage potential of the first node, and the buffer circuit is used for performing signal shaping on the voltage conversion signal to obtain an output signal and providing the output signal to a signal output terminal. The current input circuit is used for charging the first node under a condition that the detection signal indicates that the input voltage signal is greater than the reference voltage and the input current signal is greater than a reference current, so as to raise the voltage potential of the first node, so that the output signal of the interface circuit can recover a control signal outside the chip, normally control a post-stage chip, prevent the post-stage chip from being mistakenly triggered off/on, thus ensuring normal operation of a system where the interface circuit chip is located.

It should be noted that, although a device is described herein as some kind of N-channel or P-channel device, or some kind of N-type or P-type doped region, one of ordinary skill in the art can understand that complementary device may also be possibly implemented according to the present disclosure. Those of ordinary skill in the art will understand that a conductivity type is a generation mechanism of conduction (e.g., conduction through holes or electrons), therefore the conductivity type relates not to a doping concentration but to a dopant type (e.g., P-type or N-type). Those of ordinary skill in the art will understand that the terms "during" "when" and "while", which are used herein in connection with circuit operation is not a strict term for an action that occurs immediately at the beginning of the start-up action, but there may be one or more short but reasonable delay (such as various transmission delays) between that action and a reaction initiated by the start-up action. As use herein, words "approximately" or "substantially" mean that an element has a parameter that is expected to be close to a declared value or position. However, as is well known in the art, there are always minor deviations that make it difficult for the value or position of the element to be strictly the declared value or position. It has been properly determined in the art that a deviation of at least ten percent (10%) (at least twenty percent (20%) for semiconductor doping concentration) is a reasonable deviation from a described accurate ideal target. When used in conjunction with a signal state, actual voltage magnitude or logic state (e.g., "1" or "0") of a signal depends on whether positive logic or negative logic is used.

Further, it should be noted that relational terms, such as "first" and "second", etc., are used herein only to distinguish one entity or operation from another entity or operation, and do not necessarily require or imply any such actual relationship or order between these entities or operations. Moreover, terms "including", "comprising" or any other variation thereof are intended to encompass non-exclusive inclusion, so that a process, method, article or equipment that includes a set of elements may include not only those elements but also other elements that are not explicitly listed or are inherent to such a process, method, article or equipment. In the absence of more restrictions, an element defined by a statement "include/comprise a . . . " does not preclude the existence of another identical element in the process, method, article or equipment that includes said element.

Embodiments according to the present disclosure are, for example, as described above, these embodiments are not exhaustively described in all detail nor are the invention limited to the specific embodiments described. Obviously, according to the above description, many modifications and changes can be made. These embodiments are selected and specifically described in this specification in order to better explain principles and practical applications of the invention, thereby enabling those skilled in the art to make good use of the invention and modifications based on the invention. The present invention is limited only by the claims and their full scope and equivalents.

What is claimed is:

1. An interface circuit comprising a signal input terminal and a signal output terminal, wherein the interface circuit further comprises:
    a current input circuit, connected with the signal input terminal, and configured to receive an input current signal of the signal input terminal;
    an input voltage detection circuit, connected with the signal input terminal, and configured to compare an input voltage signal of the signal input terminal with a reference voltage to obtain a comparison result and provide a detection signal to the current input circuit according to the comparison result;
    a phase-inversion output circuit, connected with the current input circuit at a first node, and configured to generate a voltage conversion signal according to a voltage potential of the first node; and
    a buffer circuit, connected with the phase-inversion output circuit and the signal output terminal, and configured to perform signal shaping on the voltage conversion signal to obtain an output signal and provide the output signal to the signal output terminal,
    wherein, the current input circuit is configured to charge the first node under a condition that the detection signal indicates that the input voltage signal is greater than the reference voltage and the input current signal is greater than a reference current, so as to raise the voltage potential of the first node,
    wherein the current input circuit comprises a first current source, a first switch transistor and a second current source which are sequentially connected in series between the power supply voltage and ground,
    wherein an intermediate node between the first current source and the first switch transistor are connected with the signal input terminal,
    wherein an intermediate node between the second current source and the first switch transistor is connected to the phase-inversion output circuit at the first node, and the first switch transistor is controlled to be turned on and off by the detection signal.

2. The interface circuit according to claim 1, wherein the input voltage detection circuit comprises an operational amplifier,
    an inverting input terminal of the operational amplifier is connected with the signal input terminal to receive the input voltage signal, a non-inverting input terminal of the operational amplifier is configured to receive the reference voltage, and the output terminal of the operational amplifier is configured to provide the detection signal.

3. The interface circuit according to claim 2, wherein the phase-inversion output circuit comprises a third current source and a second switch transistor sequentially connected in series between the power supply voltage and the first node,
    wherein the second node between the third current source and the second switch transistor is configured to output the voltage conversion signal, and a control terminal of the second switch transistor is configured to receive a bias voltage.

4. The interface circuit according to claim 1, wherein the reference current is equal to a difference between an output current of the second current source and an output current of the first current source.

5. The interface circuit according to claim 3, wherein the first switch transistor is a P-type MOSFET and the second switch transistor is an N-type MOSFET.

6. The interface circuit according to claim 1, wherein the buffer circuit comprises two cascaded inverters.

* * * * *